United States Patent
Mizutani et al.

[11] Patent Number: 5,981,864
[45] Date of Patent: Nov. 9, 1999

[54] PHOTOVOLTAIC ELEMENT ARRAY AND METHOD OF FABRICATING THE SAME

[75] Inventors: Masaki Mizutani, Ichikawa; Katsumi Nakagawa, Nara, both of Japan

[73] Assignee: Canon Kabushiki Kaisha

[21] Appl. No.: 08/818,179

[22] Filed: Mar. 14, 1997

[30] Foreign Application Priority Data

Mar. 19, 1996  [JP]  Japan .................................. 8-062818

[51] Int. Cl.⁶ .................................................. H01L 25/00
[52] U.S. Cl. ........................................ 136/244; 136/256
[58] Field of Search ..................................... 136/244, 256

[56] References Cited

U.S. PATENT DOCUMENTS

| | | | |
|---|---|---|---|
| 4,292,092 | 9/1981 | Hanak | 148/1.5 |
| 4,532,372 | 7/1985 | Nath | 136/256 |
| 4,697,041 | 9/1987 | Okaniwa et al. | 136/244 |
| 5,135,581 | 8/1992 | Tran et al. | 136/256 |
| 5,296,043 | 3/1994 | Kawakami et al. | 136/244 |
| 5,397,920 | 3/1995 | Tran | 136/256 |

FOREIGN PATENT DOCUMENTS 1-194208  4/1989  Japan .

*Primary Examiner*—Mark Chapman
*Attorney, Agent, or Firm*—Fitzpatrick, Cella, Harper & Scinto

[57] ABSTRACT

A metal layer (102) is formed on an insulating substrate (101), and a first transparent conductive layer (103) containing fluorine is formed on the metal layer (102). The metal layer (102) and the transparent conductive layer (103) are electrically divided by laser irradiation to prepare lower electrodes. A photoelectric conversion layer (105) is formed on the first transparent conductive layer (103), and a second transparent conductive layer (106) is formed on the photoelectric conversion layer (105). The transparent conductive layer (106) is electrically divided by laser irradiation to form upper electrodes. Then, lower and upper electrodes adjacent to each other are electrically connected by laser irradiation. According to this method of fabricating a photovoltaic element array, the resistivity of a connecting portion which electrically connects the lower and upper electrodes can be decreased. When the connecting portion is made narrow not to decrease a light-receiving area, an increase in resistance value of the connecting portion can be prevented.

36 Claims, 4 Drawing Sheets

FIG. 4

| LAYER NAME | GAS USED FOR FILM FORMATION | GAS FLOW RATE sccm | INTERNAL PRESSURE Torr | RF POWER W | DEPOSITION TEMPERATURE °C | FILM THICKNESS nm | FORMED THIN FILM |
|---|---|---|---|---|---|---|---|
| n LAYER | SiH₄<br>PH₃ / H₂<br>H₂ | 2<br>20<br>100 | 1 | 5 | 200 | 20 | PHOSPHORUS-DOPED a-Si:H |
| i LAYER | SiH₄<br>H₂ | 50<br>500 | 1 | 50 | 20 | 400 | a-Si:H |
| p LAYER | SiH₄<br>B₂H₆ / H₂<br>H₂ | 10<br>50<br>100 | 1 | 5 | 150 | 10 | BORON-DOPED μc-Si:H |

PHOTOVOLTAIC ELEMENT ARRAY AND METHOD OF FABRICATING THE SAME

BACKGROUND OF THE INVENTION

1. Field of the Invention

The present invention relates to a photovoltaic element array and a method of fabricating the same and, more particularly, to a photovoltaic element array in which the resistance value of a connecting portion for connecting photovoltaic elements in series is decreased, and a method of fabricating the same.

2. Description of Related Art

An integrated solar battery is known in which a large number of photovoltaic elements are formed on a single substrate and connected in series in order to increase the output voltage of the solar battery. As a method of forming a large number of photovoltaic elements on a single substrate, e.g., U.S. Pat. No. 4,292,092 discloses a technique of dividing a transparent conductive layer and a photoelectric conversion layer formed on a substrate by using a laser, i.e., a laser scribing technique. U.S. Pat. No. 4,697,041 discloses a technique of electrically connecting the upper electrode of a photovoltaic element and the lower electrode of an adjacent photovoltaic element by using a laser.

In addition, e.g., U.S. Pat. No. 4,532,372 discloses a technique of effectively returning light leaking from a semiconductor layer to this semiconductor layer by arranging a transparent conductive layer between a metal layer serving as the lower electrode of a photovoltaic element and the semiconductor layer.

In order not to decrease a light-receiving area in a photovoltaic element array having photovoltaic elements connected in series, a demand arises to minimize the width of an electrical connecting portion between the upper and lower electrodes. This demand however results in an increase in resistance value of the electrical connecting portion and an increase in series resistance of the photovoltaic element array.

In a structure obtained by sequentially stacking an insulating layer of silicon carbide (SiC), a metal layer of aluminum (Al), and a transparent conductive layer of zinc oxide (ZnO) on a metal substrate, a high laser beam intensity is required to form a groove which divides the lower electrode, i.e., the metal layer and the transparent conductive layer because zinc oxide has a high transmittance with respect to a laser beam. The insulating layer is damaged by the laser beam causing short circuits with the metal substrate. Also in a structure obtained by stacking a metal layer and a transparent conductive layer on a substrate of an insulating resin film such as a polyimide film, the resin film substrate may be damaged by the energy of the laser beam.

When aluminum is used for a metal layer and zinc oxide is used for a transparent conductive layer, the transparent conductive layer conducts heat generated by laser irradiation, oxygen in zinc oxide is entrapped by aluminum, and zinc remains. As a result, the light transmittance of the transparent conductive layer is undesirably decreased. Further, when a groove which electrically divides the upper electrode, i.e., a second transparent conductive layer on a light incident side is to be formed by a laser beam, a semiconductor layer (photoelectric conversion layer) formed below the second transparent conductive layer is damaged by heat.

Further, in connecting the upper and lower electrodes using a laser, the semiconductor layer and the upper and/or lower transparent conductive layer may peel off due to the energy of the laser beam.

SUMMARY OF THE INVENTION

It is an object of the present invention to provide a method of fabricating a photovoltaic element array which solves the above problems, and a photovoltaic element array fabricated by this fabricating method.

To achieve the above object, one preferred embodiment of the present invention discloses a process for fabricating a device in which a plurality of photovoltaic elements are connected in series, comprising the steps of: forming a metal layer on a substrate; forming a first transparent conductive layer containing at least fluorine or fluoride on the metal layer; electrically dividing the metal layer and the first transparent conductive layer to form a plurality of first regions; forming a photoelectric conversion layer on the first transparent conductive layer; forming a second transparent conductive layer on the photoelectric conversion layer; electrically dividing the second transparent conductive layer to form a plurality of second regions; and electrically connecting first and second adjacent regions at least partially overlapping each other by laser irradiation at an overlapping portion.

Another preferred embodiment of the present invention discloses a device in which a plurality of photovoltaic elements are connected in series, comprising: a metal layer formed on a substrate; a first transparent conductive layer formed on the metal layer and containing at least fluorine or fluoride; a plurality of first regions formed by electrically dividing the metal layer and the first transparent conductive layer; a photoelectric conversion layer formed on the first transparent conductive layer; a second transparent conductive layer formed on the photoelectric conversion layer; a plurality of second regions formed by electrically dividing the second transparent conductive layer; and at least one connecting portion formed by laser irradiation in order to electrically connect first and second regions adjacent to each other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a table showing the formation conditions of a photovoltaic conversion layer.

DETAILED DESCRIPTION OF THE PREFERRED EMBODIMENT

A method of fabricating a photovoltaic element array according to the present invention will be described with reference to the accompanying drawings.

Figure 1A:
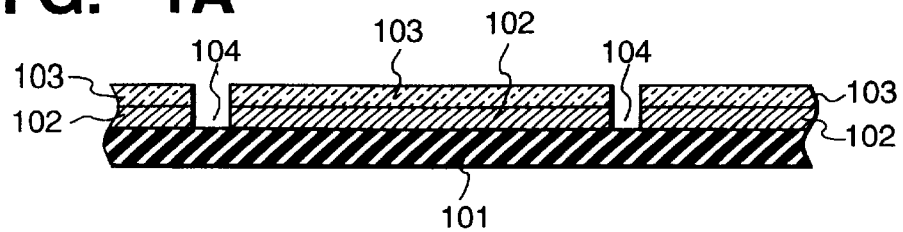
FIGS. 1A to 1D are sectional views showing a method of fabricating a photovoltaic element array according to the present invention.

FIG. 1A shows a state in which a metal layer 102 and a first transparent conductive layer 103 are deposited on the surface of an insulating substrate 101, and grooves 104 are formed. These grooves 104 electrically divide the lower electrode, i.e., the metal layer 102 and the transparent conductive layer 103.

Substrate

The substrate 101 is prepared by an insulating substrate or a conductive substrate on which an insulating layer has been formed. A preferable insulating substrate is a resin film consisting of, e.g., polyimide or polyethylene terephthalate (PET). A preferable conductive substrate is a stainless steel plate, an aluminum plate, a copper plate, or a zinc steel plate. These metal plates can be cut into a predetermined shape before being used or can be used in the form of a long sheet. Long sheets are suitable for continuous production of photovoltaic element arrays and readily storable and transportable because they can be wound into coils. The surface of the substrate can be polished or properly corrugated.

An insulating layer to be formed on the conductive substrate must have a resistivity of at least $10^{10}$ Ωcm, and preferably $10^{12}$ Ωcm or more, when irradiated with light. Also, the insulating layer must resist the temperature (usually 200° C. or higher) applied during the deposition of electrodes or semiconductor layers and the temperature (expected to be instantaneously about 1,000° C.) applied during the laser beam processing. Examples of the insulating layer which satisfy these conditions are a diamond film, a silicon film, a silicon carbide (SiC) film (composition ratio of C=0.2 or less), an aluminum oxide ($Al_2O_3$) film, a silicon nitride (SiN) film, a calcium fluoride ($CaF_2$) film, and a silicon oxide ($SiO_2$) film. Any of these films can be deposited on a substrate by using, e.g., sputtering, plasma CVD, or ion plating.

Metal Layer

The metal layer 102 is formed by depositing a metal such as gold, silver, copper, aluminum, or magnesium, or an alloy containing at least one of them on the substrate 101 by vapor deposition or sputtering to a thickness of about 0.1 μm.

First Transparent Conductive Layer

As the material of the transparent conductive layer 103, it is preferable to use metal oxides such as zinc oxide (ZnO), tin oxide (SnO), cadmium oxide (CdO), and cadmium stannate ($Cd_2SnO_4$). Further, fluorine is doped in the transparent conductive layer 103, which is the characteristic feature of the present invention. The effect of doping fluorine is as follows.

That is, when the upper and lower electrodes of a photovoltaic element are electrically connected by a laser beam, the resistivity of the connecting portion is decreased by the operation of fluorine, effectively preventing an increase in series resistance of a photovoltaic element array.

When a laser beam is used to divide the metal layer 102 and the transparent conductive layer 103 which serve as the lower electrode, the fluorine-doped transparent conductive layer 103 effectively absorbs a laser beam in the near infrared ray range, e.g., the fundamental wave of a YAG laser. For this reason, the division is facilitated, and the laser beam intensity can be decreased to prevent the damage to the substrate 101. Particularly in a case using a conductive substrate, damage, caused by laser beam irradiation, to the structure of the insulating layer, which causes short circuits, can be prevented. Also in a case using an insulating substrate such as a resin film, the resin can be prevented from being denatured.

When a photoelectric conversion layer 105 (to be described later) in contact with the transparent conductive layer 103 is an n-type semiconductor, electrical connection between the two layers is effective because the metal oxide of the fluorine-doped transparent conductive layer is of the n-type. Therefore, an ohmic-contact property can be improved.

Further, since doping of fluorine reduces an internal stress generated at the interface between the transparent conductive layer 103 and the photoelectric conversion layer 105, the transparent conductive layer 103 and the photoelectric conversion layer 105 can be prevented from peeling from each other upon irradiation of a laser beam for electrically connecting the upper and lower electrodes. At the same time, deterioration of the photovoltaic element by light and vibrations can be suppressed.

Still further, doping of fluorine can suppress a decrease in light transmittance of the transparent conductive layer 103 due to the combination of oxygen in the transparent conductive layer 103 and the components of the metal layer 102. When Al is used for the metal layer 102, this effect becomes remarkable because Al tends to combine with oxygen. In addition, doping of fluorine prevents the components of the metal layer 102 from diffusing to the photoelectric conversion layer 105, and suppresses deterioration of the photovoltaic element. This effect becomes noticeable particularly when the metal layer 102 uses silver (Ag) which tends to migrate.

The fluorine doping amount is preferably 0.05 to 30 atm %, and more preferably 0.2 to 5 atm %. The surface of the transparent conductive layer 103 may be corrugated.

The transparent conductive layer 103 is formed by a spray method using a Zn-containing gas and a fluorine-containing gas, sputtering using a fluorine-containing ZnO (ZnO:F) target, sputtering with respect to a Zn target in the fluorine atmosphere, or plasma CVD using a Zn-containing gas and a fluorine-containing gas.

Method of Dividing Lower Electrode

The lower portion dividing groove 104 for dividing the lower electrode is formed by a method using a laser beam (laser scribing).

The laser scribing can use a YAG laser, a $CO_2$ laser, an excimer laser, and the like, among which the YAG laser is preferably used. In addition to the fundamental wave of 1.06 μm, this laser scribing can also use 0.53 μm light of the second harmonic which is obtained by the YAG laser together with a nonlinear optical element. Although the YAG laser can continuously oscillate, Q-switching pulse oscillation of the laser is often used to obtain a high peak power. The frequency of this Q-switching pulse oscillation is normally a few kHz to a few tens of kHz, and the duration of one pulse is about 100 ns.

Figure 2:
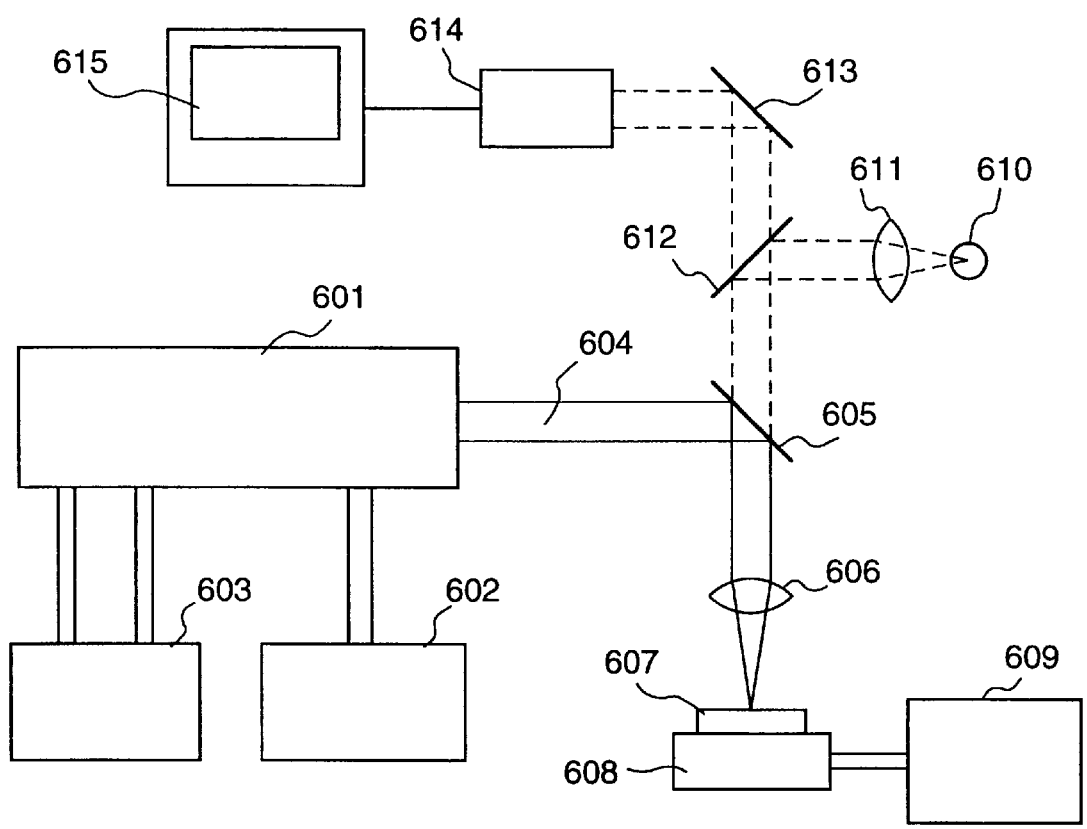
FIG. 2 is a schematic view showing a YAG laser processor.

FIG. 2 shows the outline of an optical system for laser beam processing. A laser main body 601 incorporates a Q switch or a nonlinear optical element where necessary. A power supply 602 turns on a laser exciting light source. A cooling device 603 circulates cooling water. The traveling direction of an output laser beam 604 is bent 90° by a dichroic mirror 605, and the laser beam 604 is focused on a sample 607 by a lens 606. The sample 607 is placed on a stage 608, and the stage 608 moves in a horizontal direction perpendicular to the incident direction of the laser beam 604 at a velocity determined by a controller 609. Accordingly, the laser beam 604 is scanned on the surface of the sample 607.

If the sample 607 is large, the laser beam can also be scanned by using a polygonal mirror while the sample 607 is fixed.

Output light from an illuminating light source 610 is collimated by a lens 611. The traveling direction of the collimated light is bent 90° by a dichroic mirror 612, and the light illuminates the sample 607. The reflected light by this illumination is input to an ITV camera 614 via a mirror 613. Accordingly, the operator can observe the state of laser beam processing on a monitor 615 connected to the ITV camera 614 in the same place as the processing.

Photoelectric Conversion Layer

Figure 1B:
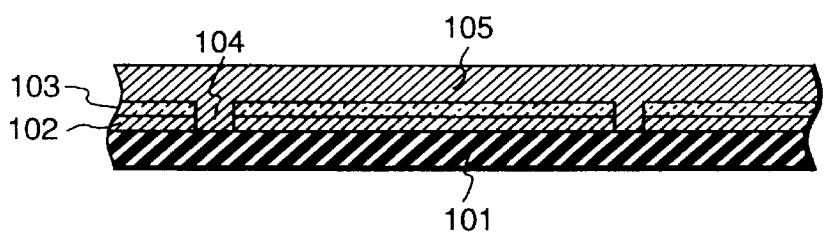

FIG. 1B shows a state in which the photoelectric conversion layer 105 is formed. The photoelectric conversion layer 105 has a structure containing a P-N junction, a PIN junction, a Schottky junction, or the like. In particular, a non-monocrystalline semiconductor containing a PIN junction is preferably used. Examples of the semiconductor are silicon (Si), silicon germanium (SiGe), and silicon carbide (SiC). Examples of a valence control agent are boron (B) and phosphorus (P). The photoelectric conversion layer 105 is formed by plasma CVD, bias sputtering, or the like. The photoelectric conversion layer 105 has a thickness of about 1,000 to 5,000 Å.

Doping of fluorine in the photoelectric conversion layer 105 contributes to a decrease in series resistance upon series connection by laser irradiation. That is, by a laser beam, the first transparent conductive layer 103, the photoelectric conversion layer 105, and a second transparent conductive layer 106 are fused and crystallized to easily decrease the resistance. Further, the alignment of the fluorine-doped first transparent conductive layer 103 and/or the second transparent conductive layer 106 is improved. At the same time, fluorine effectively serves as a terminator of a dangling bond in an amorphous semiconductor. The photoelectric conversion layer 105 may be constituted by a plurality of stacked photoelectric conversion layers.

Second Transparent Conductive Layer

Figure 1C:
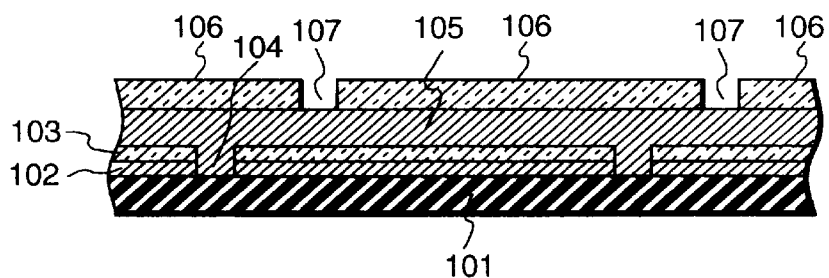

FIG. 1C shows a state in which the second transparent conductive layer 106 is formed on the photoelectric conversion layer 105 and electrically divided by upper portion dividing grooves 107. Preferable examples of the material of the transparent conductive layer 106 are indium tin oxide (ITO) and zinc oxide (ZnO). Fluorine may be doped in the transparent conductive layer 106 for the same reasons as those of the first transparent conductive layer 103 and the photoelectric conversion layer 105. The transparent conductive layer 106 is formed by resistance heating evaporation, sputtering, plasma CVD, ion plating, or the like. Formation of the upper portion dividing grooves 107 employs (1) a method using a laser beam,
(2) a method of vapor-depositing the transparent conductive layer 106 upon masking groove formation portions,
(3) a method of forming grooves by performing photolithography with respect to the uniformly deposited transparent conductive layer 106, or
(4) a method of dissolving the transparent conductive layer 106 or changing its quality to a high-resistance compound by applying power across a knife- or wire-shaped electrode arranged near the transparent conductive layer 106, and the transparent conductive layer 106.

Series Connection

Figure 1D:
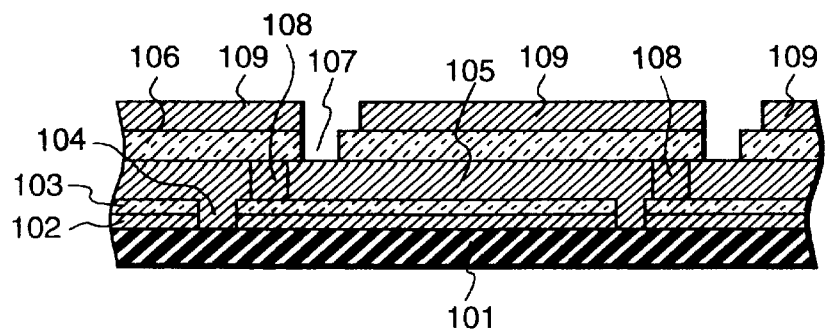
Figure 3A:
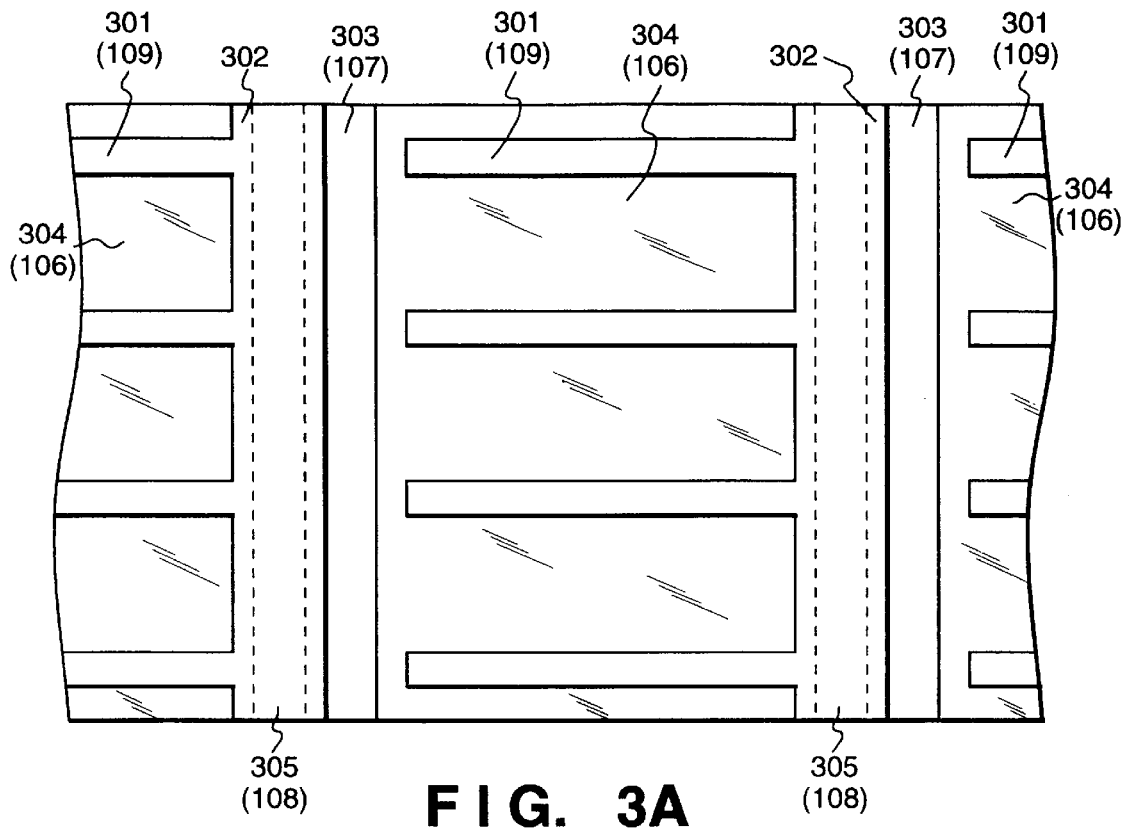
FIGS. 3A and 3B are plan views each showing a photovoltaic element array fabricated by the fabricating method of the present invention.
Figure 3B:
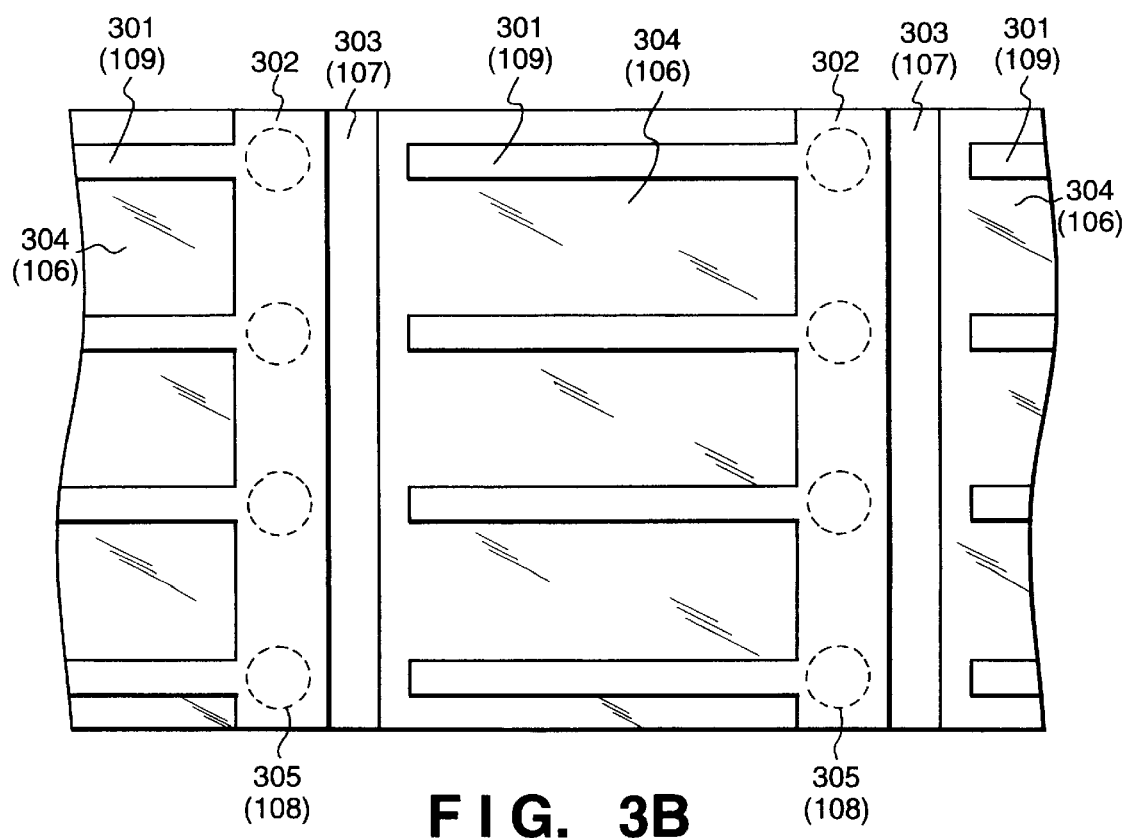

FIG. 1D shows a state in which connecting portions 108 each for connecting each first transparent conductive layer 103 and an adjacent second transparent conductive layer 106 are formed, and collector electrodes 109 are formed. The connecting portions 108 are formed by crystallizing the photoelectric conversion layer 105 or alloying it together with the transparent conductive layer 103 upon irradiation of a laser beam, i.e., the resistance of the connecting portions 108 are decreased by the irradiation of laser beam. The connecting portions 108 may have a linear shape, as shown in FIG. 3A, or a spot shape, as shown in FIG. 3B. Further, the connecting portions 108 may be formed by forming grooves upon irradiation of a laser beam and filling them with a conductive material.

Collector Electrode

FIGS. 3A and 3B are plan views of FIG. 1D. Comb-like collector electrodes 301 (109) are formed on a second transparent conductive layer 304 (106). Each collector 301 is connected to a bus-bar 302. The bus-bar 302 is formed along a corresponding upper portion dividing groove 303 (107) on a corresponding connecting portion 305 (108). The collectors 301 are formed by screen-printing a conductive paste such as a silver paste or a carbon paste, depositing silver, chromium, or the like upon placing a mask with comb-like holes, or heating and fixing under pressure a metal wire covered with a conductive paste.

Confirmation of Effect

Experiment 1

A polyimide substrate with dimensions of 10×30 cm was set in a DC magnetron sputtering apparatus and heated to 150° C. Ar gas was introduced at 50 sccm into the sputtering apparatus. A DC voltage of 400 V was applied to an Al target to generate an Ar plasma. An Al film about 3,000 Å thick for forming a metal layer 102 was deposited on the polyimide substrate.

The polyimide substrate on which the Al film was deposited was heated to 500° C. Then, acetylacetone complex salt vapors, difluorochloromethane, and $N_2$ gas were respectively sprayed at flow rates of $1 \times 10^{-3}$ mol/min, 0.05 l/min, and 2.5 l/min to deposit fluorine-containing zinc oxide (ZnO) about 600 Å thick as a first transparent conductive layer 103 on the polyimide substrate.

A sample on which the transparent conductive layer 103 was deposited was set on the stage of a laser processor. While a YAG laser was oscillated, the stage was moved to scan a laser beam, thereby forming lower portion dividing grooves 104 100 μm wide. Consequently, the lower electrode consisting of ZnO and Al was divided into ten portions at intervals of 3 cm. At this time, the continuous oscillation output of the laser was 8 W, the oscillation frequency was 4 kHz, and the scan speed was 5 cm/sec.

The sample was set in a parallel-plate capacitive coupling glow discharge apparatus, and an n layer, an i layer, and a p layer were sequentially formed as a photoelectric conversion layer 105 by RF-CVD. It was found by an electron diffraction experiment that the p layer was micro-crystallized.

ITO about 500 Å thick for forming a second transparent conductive layer 106 was deposited on the photoelectric conversion layer 105 by sputtering using an ITO target and Ar as a sputtering gas.

Again, the sample was set in the laser processor in FIG. 2. While the YAG laser was oscillated, a stage 608 was moved to scan a laser beam, thereby forming upper portion dividing grooves 107 about 100 μm wide. Consequently, the transparent conductive layer 106 was divided into 10 portions at intervals of 3 cm. Each upper portion dividing groove 107 was formed to be shifted from a corresponding lower portion dividing groove 104 by about 300 μm. A YAG laser beam was irradiated between the lower portion dividing grooves 104 and the upper portion dividing grooves 107 to crystallize the first transparent conductive layer 103, the photoelectric conversion layer 105, and the second transparent conductive layer 106, thereby forming connecting portions 108.

Finally, an Ag paste was printed in a comb shape as shown in FIG. 3A or 3B on the sample, thereby forming collector electrodes 109.

In the above manner, the photovoltaic element array (sample 1) was fabricated by connecting ten photovoltaic elements in series.

The series resistance of sample 1 was measured and found to be almost the same resistance as when unit elements with an area of 1 cm² were connected in series. For comparison, the same measurement was performed for comparison sample 1 formed not using difluorochloromethane in forming a first transparent conductive layer 103. It was found that the series resistance of comparison sample 1 was higher than that of sample 1.

An output characteristic (V-I characteristic) was measured under irradiation of AM-1.5 at a zenith angle of 48° to measure the initial photoelectric conversion efficiency. The output characteristic of sample 1 was better than that of comparison sample 1.

A section was observed by an electron microscope (SEM). Consequently, in sample 1, no peeling was found between the photoelectric conversion layer 105 and the transparent conductive layers 103 and 106. In comparison sample 1, however, they slightly peeled.

The conversion efficiency upon a light deterioration test was measured. As a result, sample 1 had characteristics superior to those of comparison sample 1.

The photovoltaic element array of the present invention was found to be excellent in characteristics.

Experiment 2

An Al film was formed on a polyimide substrate under the same conditions as in Experiment 1, thereby forming a metal layer 102.

Subsequently, a fluorine-doped ZnO layer was formed by RF sputtering as follows on the sample on which the Al film was deposited. The sample was set in a sputtering apparatus, and the polyimide substrate was heated to 350° C. Ar gas was introduced at 50 sccm into the sputtering apparatus, and the pressure was adjusted to 5 mTorr. RF power of 300 W was applied from a sputtering power supply to a ZnO:F(1%) target electrode to generate an Ar plasma. A fluorine-doped ZnO film about 500 Å thick for forming a first transparent conductive layer 103 was deposited on the sample.

Lower portion dividing grooves 104 were formed under the same conditions as in Experiment 1. Then, a photoelectric conversion layer 105 was formed under the same conditions as in Experiment 1 except that silicon tetrafluoride $SiF_4$ was used as a film formation gas instead of silane $SiH_4$ shown in FIG. 4.

ITO:F about 500 Å thick for forming a second transparent conductive layer 106 was deposited on the photoelectric conversion layer 105 by sputtering using an ITO:F target and Ar as a sputtering gas. Further, under the same conditions as Experiment 1, upper portion dividing grooves 107, connecting portions 108, and collector electrodes 109 were formed. A photovoltaic element array as sample 2 was fabricated by connecting ten photovoltaic elements. For comparison, comparison sample 2 was fabricated using a target not containing fluorine in forming a first transparent electrode layer 103 and a second transparent conductive layer 106.

Similar to Experiment 1, sample 2 and comparison sample 2 were subjected to measurement of the series resistance, measurement of the initial photoelectric conversion efficiency, section observation, and measurement of the conversion efficiency upon a light deterioration test. As a result, sample 2 had characteristics superior to comparison sample 2.

Accordingly, it was found that the photovoltaic element array of the present invention was excellent in characteristics.

Experiment 3

An Al film was formed on a polyimide substrate under the same conditions as in Experiment 1, thereby forming a metal layer 102.

Subsequently, a fluorine-doped ZnO layer was formed by RF sputtering as follows on the sample on which the Al film was deposited. The sample was set in a sputtering apparatus, and the polyimide substrate was heated to 350° C. Ar gas was introduced at 50 sccm into the sputtering apparatus, carbon tetrafluoride $CF_4$ gas was introduced at 5 sccm, and the pressure was adjusted to 5 mTorr. RF power of 300 W was applied from a sputtering power supply to a ZnO:F(1%) target electrode to generate an Ar plasma. A fluorine-doped ZnO film about 500 Å thick for forming a first transparent conductive layer 103 was deposited on the sample.

Lower portion dividing grooves 104 and a photoelectric conversion layer 105 were formed under the same conditions as in Experiment 1. Then, a mask was placed on the sample to cover portions where upper portion dividing grooves 107 were to be formed. An ITO film about 650 Å thick was deposited on the sample by sputtering. The mask was removed to form a second transparent conductive layer 106 and upper portion dividing grooves 107.

After connecting portions 108 were formed under the same conditions as in Experiment 1, a comb-like mask was placed. Chromium (about 40 nm)/silver (about 1,000 nm)/chromium (about 40 nm) were deposited on the sample by electron beam evaporation, thereby forming collector electrodes 109. A photovoltaic element array as sample 3 was fabricated by connecting ten photovoltaic elements.

For comparison, comparison sample 3 was fabricated using a ZnO target without introducing $CF_4$ gas in forming a first transparent electrode layer 103.

Similar to Experiment 1, sample 3 and comparison sample 3 were subjected to measurement of the series resistance, measurement of the initial photoelectric conversion efficiency, section observation, and measurement of the conversion efficiency upon a light deterioration test. As a result, sample 3 had characteristics superior to comparison sample 3.

Accordingly, it was found that the photovoltaic element array of the present invention was excellent in characteristics.

As has been described above, according to the photovoltaic element array fabricating method of the present invention, the resistivity of the series-connecting portion, formed by a laser beam, between the upper and lower electrodes can be decreased by doping fluorine in the transparent conductive layer. Even when the series-connecting portion is made narrow not to decrease a light-receiving area, an increase in series resistance of the photovoltaic element array can be suppressed.

According to the photovoltaic element array fabricating method of the present invention, the damage to the substrate by a laser beam can be suppressed because the fluorine-doped transparent conductive layer effectively absorbs the fundamental wave of, e.g., a YAG laser.

Further, according to the photovoltaic element array fabricating method of the present invention, doping of fluorine in the transparent conductive layer reduces an internal stress generated at the interface between the transparent conductive layer and the photoelectric conversion layer to prevent peeling between the photoelectric conversion layer and the transparent conductive layer, thereby improving the durability and the climate resistance.

Still further, according to the photovoltaic element array fabricating method of the present invention, the fluorine-doped transparent conductive layer can suppress a decrease in light transmittance due to the combination of oxygen in the transparent conductive layer and the components of the metal layer.

Moreover, according to the photovoltaic element array fabricating method of the present invention, since the fluorine-doped transparent conductive layer is of an n type, an ohmic-contact property can be improved to increase the initial conversion efficiency.

As many apparently widely different embodiments of the present invention can be made without departing from the spirit and scope thereof, it is to be understood that the invention is not limited to the specific embodiments thereof except as defined in the appended claims.

What is claimed is:

1. A process for fabricating a device in which a plurality of photovoltaic elements are connected in series, comprising the steps of:

forming a metal layer on a substrate;

forming a first transparent conductive layer containing at least fluorine atoms on said metal layer, wherein the amount of fluorine atoms doped in a material of the first transparent conductive layer is 0.05 to 30 atomic percent;

electrically dividing said metal layer and said first transparent conductive layer to form a plurality of first regions;

forming a photoelectric conversion layer on said first transparent conductive layer;

forming a second transparent conductive layer on said photoelectric conversion layer;

electrically dividing said second transparent conductive layer to form a plurality of second regions; and electrically connecting first and second adjacent regions at least partially overlapping each other by laser irradiation, which permeates through the second transparent conductive layer, at an overlapping portion.

2. The process according to claim 1, wherein said first and/or second region dividing step performs region division by laser irradiation.

3. The process according to claim 1, wherein said substrate is an insulating substrate.

4. The process according to claim 1, wherein said substrate uses an insulating resin as a main body.

5. The process according to claim 1, further comprising the step of forming an insulating layer on said substrate prior to the metal layer forming step.

6. The process according to claim 1, wherein said metal layer consists of at least one material selected from the group consisting of gold, silver, copper, aluminum, and magnesium.

7. The process according to claim 1, wherein said first transparent conductive layer contains zinc oxide.

8. The process according to claim 1, wherein said photoelectric conversion layer contains fluorine.

9. The process according to claim 1, wherein said second transparent conductive layer contains fluorine.

10. The process according to claim 1, wherein in the electrically connecting step, a laser beam is irradiated as a spot.

11. The process according to claim 1, wherein in the electrically connecting step, a laser beam is irradiated as a line.

12. The process according to claim 1, wherein the laser irradiation can use a YAG laser.

13. A device in which a plurality of photovoltaic elements are connected in series, comprising:

a metal layer formed on a substrate;

a first transparent conductive layer formed on said metal layer and containing at least fluorine atoms, wherein the amount of fluorine atoms doped in a material of the first transparent conductive layer is 0.05 to 30 atomic percent;

a plurality of first regions formed by electrically dividing said metal layer and said first transparent conductive layer;

a photoelectric conversion layer formed on said first transparent conductive layer;

a second transparent conductive layer formed on said photoelectric conversion layer;

a plurality of second regions formed by electrically dividing said second transparent conductive layer; and at least one connecting portion formed by laser irradiation in order to electrically connecting first and second adjacent regions to each other, wherein the at least one connecting portion is formed at an overlapping portion of the first and second regions.

14. The device according to claim 13, wherein said first and/or second region is formed by division by laser irradiation.

15. The device according to claim 13, wherein said substrate is an insulating substrate.

16. The device according to claim 13, wherein said substrate uses an insulating resin as a main body.

17. The device according to claim 13, further comprising an insulating layer formed on said substrate prior to the metal layer.

18. The device according to claim 13, wherein said metal layer consists of at least one material selected from the group consisting of gold, silver, copper, aluminum, and magnesium.

19. The device according to claim 13, wherein said first transparent conductive layer contains zinc oxide.

20. The device according to claim 13, wherein said photoelectric conversion layer contains fluorine.

21. The device according to claim 13, wherein said second transparent conductive layer contains fluorine.

22. The device according to claim 13, wherein said at least one connecting portion has a portion to which said photoelectric conversion layer is crystallized.

23. The device according to claim 13, wherein said at least one connecting portion has a portion to which said photoelectric conversion layer and said first or second transparent conductive layer are metalized.

24. The device according to claim 13, wherein said at least one connecting portion is formed as a spot.

25. The device according to claim 13, wherein said at least one connection portion is formed as a line.

26. A device in which a plurality of photovoltaic elements are connect in series, comprising:

a metal layer formed on an insulating substrate;

a first transparent conductive layer formed on said metal layer by a metal oxide containing at least fluorine atoms which are doped in a material of the first transparent conductive layer in an amount from 0.05 to 30 atomic percent;

first regions formed as islands from said metal layer and said first transparent conductive layer;

a photoelectric conversion layer formed on said first transparent conductive layer;

a second transparent conductive layer formed on said photoelectric conversion layer;

second regions formed as islands from said second transparent conductive layer, wherein said first and second adjacent regions at least partially overlap each other; and connecting portions formed at the overlapping portion of said first and second regions in said photoelectric conversion layer.

27. The device according to claim 26, wherein the insulating substrate is formed by resin.

28. The device according to claim 26, wherein the insulating substrate is a metal substrate having an insulating layer.

29. The device according to claim 26, wherein at least one material of said metal layer is selected from materials comprising gold, silver, copper, aluminum and magnesium.

30. The device according to claim 26, wherein said first transparent conductive layer contains a zinc oxide.

31. The device according to claim 26, wherein said photoelectric conversion layer contains fluorine.

32. The device according to claim 26, wherein said second transparent conductive layer contains fluorine.

33. The device according to claim 26, wherein each of said connecting portions has a portion to which said photoelectric conversion layer is crystallized.

34. The device according to claim 26, wherein each of said connecting portions has a portion to which said first and second transparent conductive layers are alloyed.

35. The device according to claim 26, wherein each of said connecting portions is formed as a spot.

36. The device according to claim 26, wherein each of said connecting portions is formed as a line.

* * * * *

UNITED STATES PATENT AND TRADEMARK OFFICE
CERTIFICATE OF CORRECTION

PATENT NO. : 5,981,864
DATED : November 9, 1999
INVENTOR(S) : MASAKI MIZUTANI ET AL.

It is certified that error appears in the above-identified patent and that said Letters Patent is hereby corrected as shown below:

COLUMN 10

Line 26, "connecting" should read --connect--.

Signed and Sealed this

Second Day of January, 2001

Attest:

Attesting Officer

Q. TODD DICKINSON
Commissioner of Patents and Trademarks